US009048068B2

(12) United States Patent
Lanio et al.

(10) Patent No.: US 9,048,068 B2
(45) Date of Patent: Jun. 2, 2015

(54) ELECTRON BEAM DEVICE WITH DISPERSION COMPENSATION, AND METHOD OF OPERATING SAME

(75) Inventors: Stefan Lanio, Erding (DE); Gerald Schoenecker, Munich (DE)

(73) Assignee: ICT Integrated Circuit Testing Gesellschaft für Halbleiterprüftechnik GmbH, Heimstetten (DE)

( * ) Notice: Subject to any disclaimer, the term of this patent is extended or adjusted under 35 U.S.C. 154(b) by 254 days.

(21) Appl. No.: 12/776,980

(22) Filed: May 10, 2010

(65) Prior Publication Data

US 2011/0272577 A1 Nov. 10, 2011

(30) Foreign Application Priority Data

May 7, 2010 (EP) .................................... 10162334

(51) Int. Cl.
H01J 37/28 (2006.01)
H01J 37/147 (2006.01)
H01J 37/153 (2006.01)

(52) U.S. Cl.
CPC ............. *H01J 37/28* (2013.01); *H01J 37/1471* (2013.01); *H01J 37/153* (2013.01); *H01J 2237/1523* (2013.01); *H01J 2237/1534* (2013.01); *H01J 2237/244* (2013.01)

(58) Field of Classification Search
CPC ......... H01J 37/09; H01J 37/18; H01J 37/301; H01J 2237/188; H01J 2237/0455; H01J 2237/0458; H01J 2237/1508
USPC ............... 250/306, 307, 310, 396 ML, 396 R
See application file for complete search history.

(56) References Cited

U.S. PATENT DOCUMENTS 4,703,276 A * 10/1987 Beer .............................. 324/319
4,743,756 A * 5/1988 Krivanek ...................... 250/305

(Continued)

FOREIGN PATENT DOCUMENTS

| JP | 2003-187730 A | 7/2003 |
| JP | 2004-342341 A | 12/2004 |
| WO | WO-00/36630 | 6/2000 |

OTHER PUBLICATIONS

Rose, H.; Wan, W., "Aberration Correction in Electron Microscopy," Particle Accelerator Conference, 2005. PAC 2005. Proceedings of the , vol., no., pp. 44,48, May 16-20, 2005 doi: 10.1109/PAC.2005. 1590354.*

(Continued)

*Primary Examiner* — Brooke Purinton
(74) *Attorney, Agent, or Firm* — Patterson & Sheridan, LLP

(57) ABSTRACT

An electron beam device comprises: a beam emitter for emitting a primary electron beam; an objective electron lens for focusing the primary electron beam onto a specimen, the objective lens defining an optical axis; a beam separator having a first dispersion for separating a signal electron beam from the primary electron beam; and a dispersion compensation element. The dispersion compensation element has a second dispersion, the dispersion compensation element being adapted for adjusting the second dispersion independently of an inclination angle of the primary beam downstream of the dispersion compensation element, such that the second dispersion substantially compensates the first dispersion. The dispersion compensation element is arranged upstream, along the primary electron beam, of the beam separator.

16 Claims, 6 Drawing Sheets

(56) References Cited

U.S. PATENT DOCUMENTS

| | | | | |
|---|---|---|---|---|
| 4,941,915 | A * | 7/1990 | Matsuoka et al. | 204/298.12 |
| 5,415,754 | A * | 5/1995 | Manley | 204/192.12 |
| 5,422,486 | A | 6/1995 | Herrmann et al. | |
| 5,523,577 | A * | 6/1996 | Schonberg et al. | 250/492.3 |
| 6,674,230 | B1 * | 1/2004 | Carpinelli et al. | 313/433 |
| 6,847,168 | B1 * | 1/2005 | Ives et al. | 315/5.14 |
| 7,164,139 | B1 * | 1/2007 | Toth et al. | 250/396 ML |
| 7,932,495 | B2 * | 4/2011 | Adamec | 250/307 |
| 2002/0008451 | A1 * | 1/2002 | Gibson | 313/231.31 |
| 2002/0104966 | A1 * | 8/2002 | Plies et al. | 250/311 |
| 2003/0184205 | A1 * | 10/2003 | Johnson | 313/359.1 |
| 2004/0188630 | A1 * | 9/2004 | Brunner et al. | 250/396 R |
| 2004/0227081 | A1 | 11/2004 | Sato et al. | |
| 2005/0035292 | A1 | 2/2005 | Adamec et al. | |
| 2005/0258784 | A1 * | 11/2005 | Makita et al. | 315/502 |
| 2006/0016992 | A1 * | 1/2006 | Sato et al. | 250/311 |
| 2006/0118719 | A1 * | 6/2006 | Watanabe et al. | 250/310 |
| 2006/0151711 | A1 | 7/2006 | Frosien et al. | |
| 2006/0232369 | A1 * | 10/2006 | Gorshkov | 335/306 |
| 2007/0200062 | A1 * | 8/2007 | Tromp | 250/305 |
| 2007/0200070 | A1 * | 8/2007 | Tromp | 250/396 R |
| 2008/0042074 | A1 * | 2/2008 | Sato et al. | 250/396 R |
| 2008/0237463 | A1 * | 10/2008 | Ose et al. | 250/311 |
| 2009/0107895 | A1 * | 4/2009 | Suzuki | 209/562 |
| 2009/0212213 | A1 | 8/2009 | Nakasuji et al. | |
| 2009/0218506 | A1 * | 9/2009 | Nakasuji et al. | 250/396 ML |
| 2010/0044565 | A1 * | 2/2010 | Mori et al. | 250/310 |
| 2010/0230590 | A1 * | 9/2010 | Bierhoff et al. | 250/310 |
| 2010/0301211 | A1 * | 12/2010 | Miller | 250/307 |
| 2010/0320382 | A1 * | 12/2010 | Almogy et al. | 250/307 |
| 2011/0163229 | A1 * | 7/2011 | Frosien et al. | 250/310 |

OTHER PUBLICATIONS

Extended European Search Report dated Sep. 16, 2010 for European Patent Application No. 10162334.6.

* cited by examiner

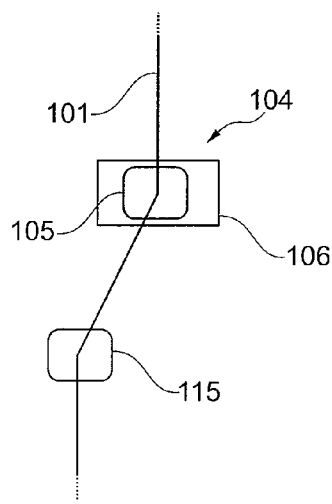
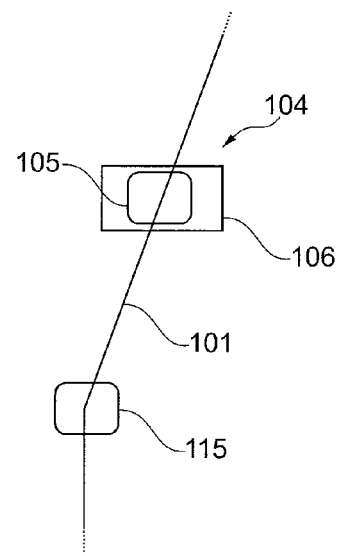
Fig. 3a  Fig. 3b
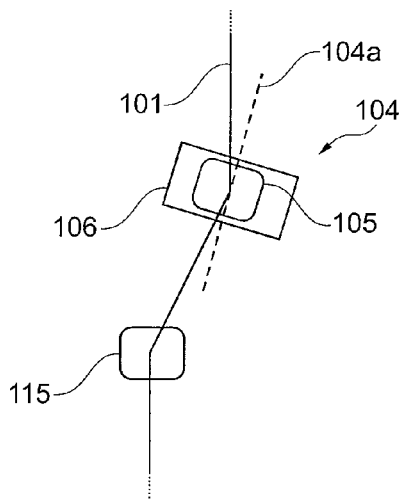
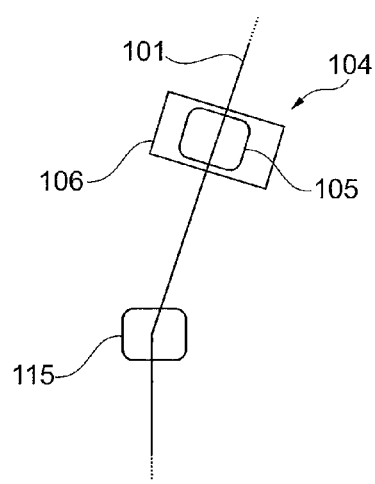
Fig. 3c  Fig. 3d

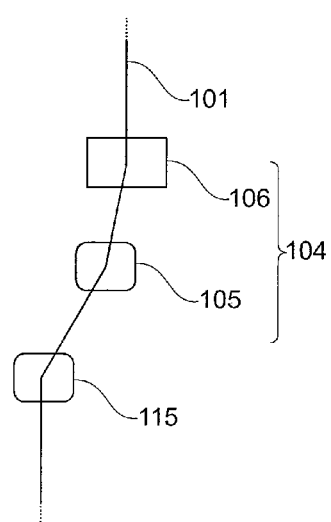
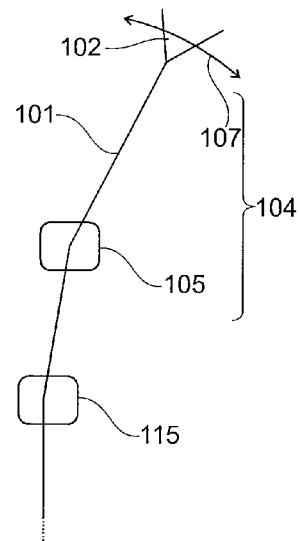
Fig. 3e          Fig. 3f
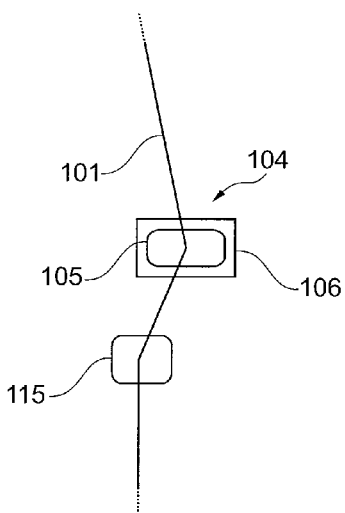
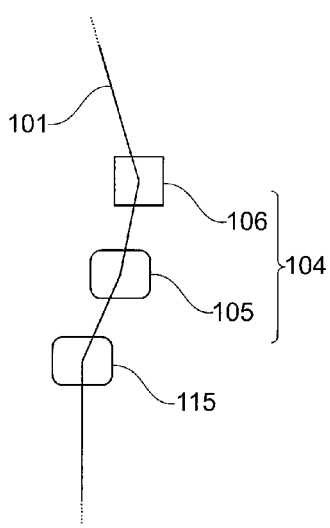
Fig. 3g          Fig. 3h

ELECTRON BEAM DEVICE WITH DISPERSION COMPENSATION, AND METHOD OF OPERATING SAME

FIELD OF THE INVENTION

Aspects of the invention relate to an electron beam device, e.g. for imaging or for manipulating a specimen, and a method of operating the same. More particularly, aspects of the invention relate to an electron beam device including a beam emitter; an objective electron lens; and a beam separator for separating a signal electron beam from the primary electron beam.

BACKGROUND OF THE INVENTION

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

In particular, semiconductor technologies have created a high demand for structuring and probing specimens within the nanometer scale. Micrometer and nanometer scale process control, inspection or structuring, is often done with electron beams. Probing or structuring is often performed with electron beams which are generated and focused in electron beam devices. Examples of electron beam devices are electron microscopes, in particular scanning electron microscopes (SEM), or electron beam pattern generators. Electron beams offer superior spatial resolution compared to photon beams, due to their short wavelengths at comparable particle energy.

For semiconductor manufacturing, throughput can be a significant limitation in tools for scanning a geometry in its entirety. Assuming a SEM resolution of 1 nm, a 10 mm² die contains 10E14 pixels. Accordingly, for covering the entire layout, a fast inspection architecture is desired. For achieving high throughput at a desired signal to noise ratio (SNR), it is desired to have an electron beam device with a high electron beam intensity.

However, at high electron beam intensity the interaction between electrons of the electron beam have an increasing effect on the beam. Due to the electron-electron interactions, the energy and spatial resolution of the beam is decreased. Therefore, measures to mitigate the electron-electron interactions of the beam have been devised, such as a broadening of the primary electron beam. However, there is still a need to reduce the effect of electron-electron interactions even further.

SUMMARY OF THE INVENTION

In light of the above, the present invention intends to provide an improved charged particle beam device, an improved method of operating a charged particle beam device and a method of manufacturing the charged particle device.

The object is solved by the charged particle device according to independent claim 1, and by the method according to independent claim 15. Further advantages, features, aspects and details of the invention are evident from the dependent claims, the description and the drawings.

According to one embodiment, an electron beam device includes a beam emitter for emitting a primary electron beam; an objective electron lens for focusing the primary electron beam onto a specimen, the objective lens defining an optical axis; a beam separator having a first dispersion for separating a signal electron beam from the primary electron beam; and a dispersion compensation element having a second dispersion. The dispersion compensation element is adapted for adjusting the second dispersion independently of an inclination angle of the primary beam downstream of the dispersion compensation element, such that the second dispersion substantially compensates the first dispersion. The dispersion compensation element is arranged upstream, along the primary electron beam, of the beam separator.

According to another embodiment, a method of operating an electron beam device includes: Generating a primary electron beam; focusing, by means of an objective electron lens, the primary electron beam onto a specimen; generating a signal electron beam by interaction of the primary beam with the specimen; acting, by a beam separator, on the primary electron beam and on the signal electron beam according to a first dispersion thereby separating the signal electron beam from the primary electron beam; and adjusting a second dispersion of a dispersion compensation element, independently of an inclination angle of the primary beam downstream of the dispersion compensation element, such that the dispersion compensation element acts on the primary beam according to the second dispersion such as to e.g. substantially compensate the first dispersion.

Embodiments are also directed to methods by which the described apparatus operates. The methods include method steps for carrying out every function of the apparatus. Further, embodiments are also directed to a beam apparatus having a controller adapted for carrying out any of the method steps described herein.

BRIEF DESCRIPTION OF THE DRAWINGS

Some of the above indicated and other more detailed aspects of the invention will be described in the following description and partially illustrated with reference to the figures. Therein:

FIGS. 3a to 3h show schematic side views of respective dispersion compensation elements of electron beam apparatuses according to further embodiments;

DETAILED DESCRIPTION OF THE DRAWINGS

In the following passages different aspects of the invention are defined in more detail. Without limiting the scope of the present application, the electron beam apparatus might be adapted for inspection or lithography, such as a scanning electron microscope (SEM) or the like.

Figure 5:
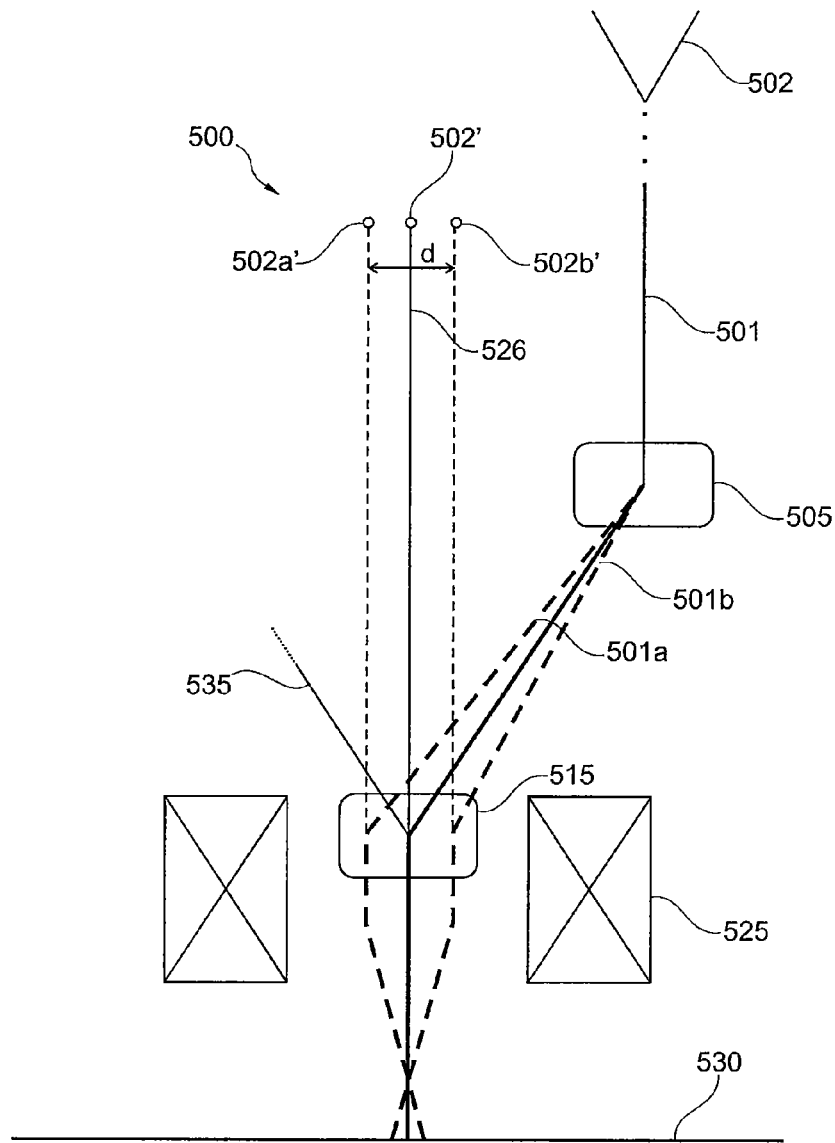
FIG. 5 shows a schematic side view of an electron beam apparatus according to a comparative example.

So that the advantages of the embodiments can be better appreciated, first an illustrative example will be described with reference to FIG. 5. FIG. 5 shows an optical system 500 similar to the system described in the published patent application US 2006/0151711. In the optical system 500, a primary-electron beam 501 from an emitter (not shown) is bent (changes direction) as it passes through a magnetic beam deflection coil 505, and changes direction again as it passes through a further magnetic beam deflection coil 515. The primary-electron beam 501 is then focused onto a sample 530 by an objective lens 525 (e.g. electrostatic and/or magnetic focussing lens) defining an optical axis 526. A signal electron beam 535, resulting from an interaction of the primary beam 501 with the sample 530, then travels along the opposite direction. The signal electron beam 535 is bent as it passes through the further magnetic-beam separator deflection coil 515 and is thereby separated from the primary beam 501. Then, the signal beam 535 is guided to a detector (not shown).

In the system of FIG. 5, the deflection of the primary beam 501 due to coil 505 is the same in magnitude and opposite in sign as its deflection due to coil 515. The purpose of this arrangement is to allow a column which is vertically aligned, and hence allows vertically aligned optical elements in the regions upstream the deflection coil 505 and downstream of the deflector 515, despite the fact that the deflection coil 515 deflects the beam. The double deflection further has the effect of displacing the beam 501 as shown in FIG. 5. Thus, when entering the objective lens 525, the beam 501 seems to emerge from a virtual source 502' that is displaced with respect to the real source 502. The objective lens 525 is arranged such that the virtual source 502' lies on the optical axis 526 defined by the objective lens 525.

However, by the arrangement of FIG. 5 the image is blurred due to dispersion: In FIG. 5, in addition to the primary beam 501 as represented by the main energy beam portion of the beam 501, a beam portion 501*a* with lower energy, and a beam portion 501*b* with higher energy than the mean energy is shown. Also for the beam portions 501*a* and 501*b*, the deflection due to coil 505 is the same in magnitude and opposite in sign as the deflection due to coil 515. However, the lower-energy beam portion 501*a* is deflected by both coils 505, 515 to a larger degree, and is therefore finally displaced more than the main-energy beam portion 501. Hence, the virtual source 502*a*' of the lower-energy beam portion 501*a* is displaced with respect to the virtual source 502' of the main beam portion. Similarly, the higher-energy beam portion 501*b* is deflected by both coils 505, 515 to a lesser degree, and is therefore displaced less than the main-energy beam portion 501. Hence, the virtual source 502*b*' of the higher-energy beam portion 501*b* is displaced with respect to the virtual source 502' of the main beam portion. As a result, a beam containing the beam portions 501*a* and 501*b* seems to come from a line-like virtual source of width d instead of a point-like virtual source, and the beam hitting on the specimen is correspondingly widened in the deflection direction (i.e. the direction orthogonal to the optical axis 526 in the drawing plane of FIG. 5). This widening limits the available resolution in the deflection direction. Thus, there is a chromatic aberration, i.e. a variation, with respect to the beam energy, of the location at which the primary beam hits the specimen. Here, a first-order chromatic aberration of the electron beam apparatus is defined as the first derivative, with respect to the beam energy, of the location at which the primary beam hits the specimen, at the main beam energy.

In summary, with the apparatus of FIG. 5 the location of the beam hitting the specimen is energy (momentum) dependent, causing the beam to be widened in the deflection direction perpendicular to the optical axis.

In the following, embodiments of the invention are described which reduce the disadvantage mentioned with respect to the above-described illustrative example of FIG. 5. Within the following description of the drawings, reference numbers having the same last two digits refer to the same or similar components. Generally, only the differences with respect to the individual embodiments are described, so that the description of any one embodiment can also be applied to another embodiment, unless otherwise stated. In particular any feature indicated as being preferred or advantageous is optional. Also, such a feature indicated as being preferred or advantageous may be combined with any other feature or features indicated as being preferred or advantageous.

Figure 1:
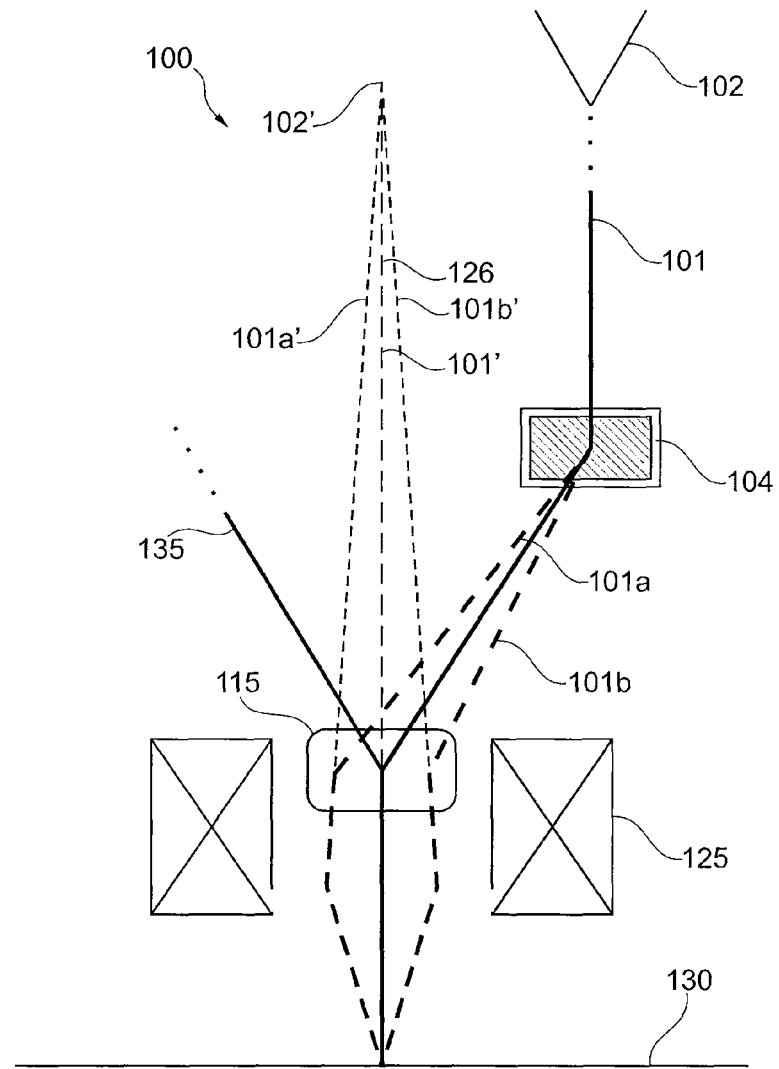
FIG. 1 shows a schematic side view of an electron beam apparatus according to a first embodiment.

FIG. 1 shows an electron beam device according to a first embodiment of the invention. The electron beam device 100 includes a beam emitter 102 for emitting a primary electron beam 101, and an objective electron lens 125 for focusing the primary electron beam 101 onto a specimen 130, the objective lens defining an optical axis 126. A specimen, as referred to herein, includes, but is not limited to, semiconductor wafers, semiconductor workpieces, and other workpieces such as optical blanks, memory disks and the like. Embodiments of the invention may be applied to any workpiece on which material is deposited or which are structured. A specimen includes a flat surface to be structured or on which layers are deposited, an opposing surface, an edge, and typically a bevel. The objective lens 125 is a final focusing lens. In the following, no clear distinction is made between the lens (i.e. elements generating a focusing field for focusing the beam on the specimen and the focusing field itself) and the lens body (the body containing these elements and possibly further related elements in a body having a lens bore for the electron beam). As used in the following, the term "lens" may also refer to the lens body. The lens may be a multiple-element lens such as a combined electrostatic-magnetic lens provided in a common lens housing. In FIG. 1, only the magnetic portion of the combined electrostatic-magnetic lens is shown. Alternatively, the lens may be e.g. an electrostatic lens. As a general aspect independent of the shown embodiment, the objective lens may be arranged at a distance of less than 100 mm or even less than 50 mm, and/or of less than ¼ of the total primary beam length, from the specimen (specimen plane).

The electron beam device 100 further includes a beam separator 115. The beam separator 115 is a magnetic beam separator, in particular may be a purely magnetic beam separator. The beam separator 115 may be immersed in the body of the objective lens 125, e.g. located essentially ("essentially" means by more than half of the beam separator's length along the optical axis) within or downstream of the body, in particular at least partially within or downstream a bore of the objective lens 125, see FIG. 4. Also, especially in the case of an electrostatic lens, the beam separator 115 may be located upstream of the objective lens 125. The beam separator 115 may be located directly upstream of the objective lens 125, i.e. with essentially no other electron-optical element between the beam separator 115 and the objective lens 125, along the electron beam path 101. Alternatively, e.g. a beam scanner, such as a magnetic and/or electrostatic scanner may be arranged, along the beam path, between beam separator 115 and the objective lens 125.

The magnetic beam separator 115 has a first dispersion. Here, an element having a dispersion (or dispersion relation) means that the element is adapted for acting on the electron beam according to the dispersion (dispersion relation), i.e. to deflect electrons of the beam by a deflection angle which depends on the electron energy or momentum. The first dispersion is anisotropic and defines a first deflection direction (direction within the drawing plane of FIG. 1 and orthogonal to the optical axis 126).

Due to the first dispersion, the magnetic beam separator 115 is able to separate a signal electron beam 135 from the primary electron beam 101 (according to their different momentum or direction). Here, signal electrons are defined as electrons travelling in an essentially opposite direction from the primary beam electrons, and the signal electrons may, in particular, include secondary electrons, auger electrons, and/or backscattered electrons.

In more detail, here, the beam separator 115 has a deflection coil for deflecting the primary electron beam 101. The deflection coil generates a transverse magnetic field for separating the signal electron beam 135 from the primary electron beam 101. The transverse field is orthogonal to the drawing plane of FIG. 1. When the electrons of the beams 101 and 135 traverse the magnetic field, they experience a force which is dependent upon the electron velocity (Lorentz force law). Since the primary electrons (beam 101) and signal electrons (beam 135) are essentially traveling in opposite directions, the force acting upon the two beams will be opposite in direction when traveling through the transverse magnetic field. Thus, the primary beam 101 and the secondary beam 135 are both deflected, by angles of opposite sign.

In particular, the magnetic beam separator may be a purely magnetic beam separator, i.e. it includes a magnetic element (e.g. magnetic coil or dipole element) as the only deflecting element, and no other, e.g. electrostatic, deflecting component. Thus, the electron beam device 100 is configured such that no electrostatic deflecting field acts on the primary beam 101 at the location of the beam separator 115 (as would be the case, for example, for a Wien filter).

Using a purely magnetic deflector as the beam separator 115 has the advantage that the region inside the objective lens 125 can be kept free of parts that require intensive servicing. For example, electrostatic deflectors are prone to contamination and therefore require frequent servicing. By having a dispersion compensation element 104, described below, upstream of the beam separator 115, the latter can have a simple construction which does not require serviceable parts. This allows the beam separator 115 to be immersed in the body of the objective lens, which is difficult to access for servicing.

As a further general aspect, the beam separator 115 is a deflector which induces a deflection angle which smoothly depends on the beam energy of the primary beam 101. Hence, the deflector is different from an energy filter allowing only electrons above a threshold energy to pass. As a further general aspect, the beam separator 115 deflects the primary electrons to a direction which is essentially along the optical axis defined by the objective lens.

The electron beam device 100 further includes a dispersion compensation element 104. The dispersion compensation element 104 is arranged upstream, along the primary electron beam 101, of the beam separator 115. As an aspect of the invention independently of the shown embodiment, the secondary electrons do not reach the dispersion compensation element 104, in other words the dispersion compensation element 104 is arranged outside a signal electron beam 135 path of the electron beam device 100, such that it influences only the primary beam but not directly the signal electron beam 135. Some possible realizations of the dispersion compensation element 104 are described in more detail further below with reference to FIGS. 2 and 3a-3h. The dispersion compensation element 104 of FIG. 1 may be realized according to any one of these Figures, e.g. according to FIG. 3a described further below.

Continuing the description of FIG. 1, the dispersion compensation element 104 has a second dispersion, i.e. the dispersion compensation element is adapted for acting on the primary beam according to the second dispersion. The second dispersion is anisotropic defining a second deflection direction parallel (which includes the case antiparallel) to the first deflection direction, defined by the beam separator 115. Herein, the labels "first", "second" do not imply any order along the beam path.

Further, the dispersion compensation element 104 allows adjusting the second dispersion. More particularly, the second dispersion can be adjusted such that the second dispersion substantially compensates the first dispersion. This compensation of the first dispersion is to be understood as follows: By adjusting the second dispersion of the dispersion compensation element 104, it is possible to adjust the first derivative, with respect to the beam energy, of the beam location at which the primary beam 101 electrons hit the specimen 130 (defined as the first-order chromatic aberration). The first dispersion is compensated when this first derivative is brought to zero (or, in practice, close to zero i.e. the beam widening is at least considerably reduced, compared to the case for which the second dispersion is not adjusted). Thus, the dispersion compensation element 104 allows adjusting the second dispersion such that the above-mentioned first derivative of the beam location is brought to zero or close to zero. In consequence, the mean beam width can be reduced considerably.

While the adjustment of the second dispersion allows compensating the first dispersion such as to give a zero or substantially reduced chromatic aberration, there may be applications in which some pre-determined energy-dependence of the electron beam hitting the specimen is actually desired. In this case the dispersion compensation element may also be controlled in such a way that this pre-determined energy-dependence is achieved.

The adjustment of the second dispersion can be performed automatically by a dispersion compensation controller (as shown e.g. in FIG. 2b) or by manual adjustment. The adjustment can also be done e.g. during setup of the apparatus, and the adjusted dispersion is then hard-wired into the control of the dispersion compensation element 104.

Further, the dispersion compensation element 104 is adapted for adjusting the second dispersion independently of an inclination angle of the primary beam 101 downstream of the dispersion compensation element 104. In other words, the dispersion compensation element 104 is adapted for adjusting the second dispersion without substantially affecting the inclination angle of the primary beam 101 path downstream of the dispersion compensation element 104. The inclination angle is defined relative to the optical axis 126.

The dispersion compensation element 104 may be adapted for adjusting the second dispersion relation independently of the entire path of the primary beam 101 from the emitter to the specimen 130; i.e. the dispersion compensation element acts in a dispersive manner without affecting significantly the entire primary beam 101 path (this is the case in FIGS. 1, 2, 3a and 3b).

Within this description, the apparatus may be adapted for the functions described herein e.g. by a controller that is programmed, hard-wired, or in any other manner adapted for achieving that function. The controller may be provided as an electronic, in particular as a digital controller, but also e.g. as an electrical circuit or by mechanical coupling elements, to achieve the desired function.

Clearly, the path-independent adjustment is possible only for primary beam electrons of a particular energy at or near the main beam energy: Due to the second dispersion, the inclination angle of the primary beam path downstream of the dispersion compensation element will depend on the beam energy. "Without substantially affecting the inclination angle" therefore means that there is an energy at or near the main beam energy of beam 101 (e.g. an energy away from the mean beam energy by less than five times or even less than two times of the beam energy width), at which energy the inclination angle is not affected noticeably when adjusting the second dispersion by a small amount (e.g. to linear order).

Thus, in the electron beam device 100 of FIG. 1, the primary-electron beam 101 from the emitter 102 passes through the dispersion compensation element 104 and undergoes the second dispersion. At the same time, the primary beam 101 may be deflected (as shown in FIG. 1). The primary beam 101 leaves the dispersion compensation element 104 at an inclined angle with respect to the optical axis 126, and is received in the beam separator 115 at the inclined angle. The inclination angle of the primary electron beam 101 directly upstream of the beam separator 115 is generally non-zero but less than 10°.

The primary-electron beam 101 then passes through the magnetic beam separator 115 and is deflected therein, such that the primary beam 101 becomes essentially parallel to or even coinciding with the optical axis downstream of the beam separator 115. At the same time, the primary beam 101 undergoes the first dispersion. The primary-electron beam 101 is then focused by the objective lens 125 to strike the sample 130, such as a semiconductor wafer. Because the first dispersion has been compensated by the second dispersion, the beam 101 hits the sample 130 with high resolution.

The secondary-electron beam 135 resulting from the interaction of the primary beam 101 with the sample 130 passes again, but in opposite direction, through the objective lens 125 and is deflected as it passes through the magnetic beam separator 115 and is thereby separated from the primary beam 101 (as described above). The secondary-electron beam 135, after having been separated from the primary beam 101, is then guided to an electron detector (by elements not shown in FIG. 1).

The device of FIG. 1 has the further advantage that it allows a high-intensity beam, and therefore enables fast inspection at high throughput at a good signal to noise ratio: Namely, because the beam separator 115 is immersed in the body of the objective lens 125, the common path for the primary beam 101 and the secondary beam 135 is very short. Thereby, inter-beam electron-electron interactions (i.e. interactions between electrons of the primary beam 101 and electrons of the secondary beam 135) are reduced.

The effect of such inter-beam interactions has previously not been taken much into account. However, the inventors have found indirect but convincing evidence indicating that such inter-beam interactions have a significant negative effect on image quality: Namely, in an apparatus such as the one shown in FIG. 1 and at large beam intensities and energies, an extra contribution to the blurring of the primary beam 101 was found. This extra contribution can be explained by the fact that the inter-beam interactions involve head-on electron-electron collisions. These collisions cause unwanted beam widening and are detrimental to the attainable resolution. The head-on collisions are therefore expected to be particularly detrimental at high beam energies and intensities.

This extra contribution to blurring was reduced when the common beam path was made shorter. Namely, by shortening the path at which such head-on collisions can occur (i.e. the common beam path between the primary beam 101 and the signal electron beam 135), the beam intensity can be increased at a given level of tolerated head-on collisions. The short common beam path can be achieved by the beam separator 115 being immersed in the body of the objective lens 125, or being arranged directly upstream or downstream of the objective lens. Thereby, the distance of the beam separator 115 from a specimen plane 131 (plane at which the electron beam hits the specimen 130) can be made less than 100 mm, in some embodiments even less than 70 mm or even 50 mm, such that the common path of the primary and signal electrons is less than 100 mm, 70 mm or 50 mm. Also, the common path of the primary and signal electrons may be made shorter than 25% of the total primary beam length, i.e. the primary beam length from the electron source to the specimen. The high-intensity beam thus obtainable enables a fast inspection at high throughput and at a good signal to noise ratio.

In summary, the apparatus of FIG. 1 allows a minimized collision length of primary and secondary beam, that enables high-intensity operation at high spatial resolution.

The apparatus of FIG. 1 may have additional elements such as a condenser lens e.g. upstream the objective lens and in particular upstream of the dispersion compensation element.

With reference to FIGS. 2 and 3a-d, further embodiments will now be described. The more general description of FIG. 1 also applies to these further embodiments.

Figure 2A:
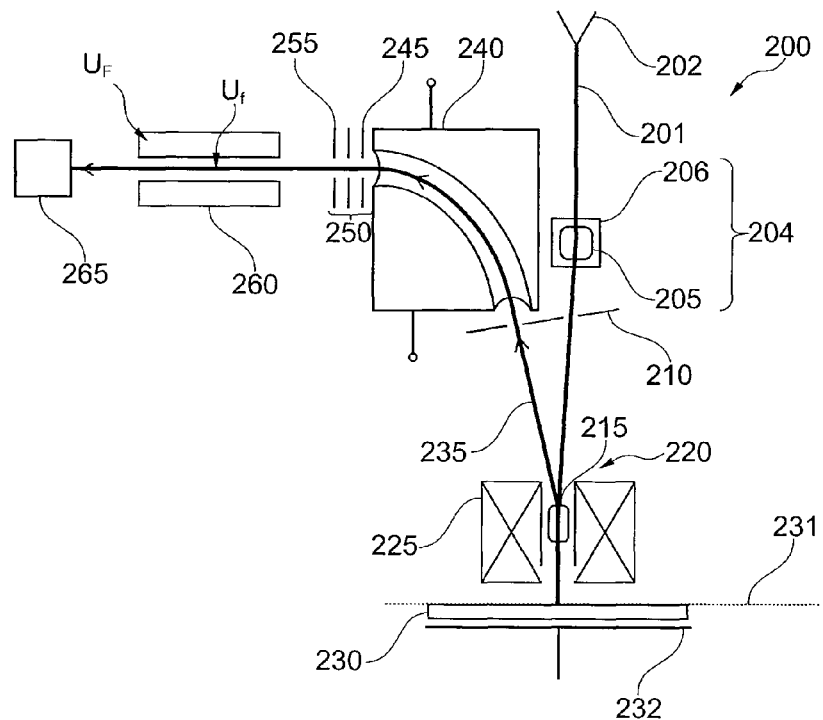
FIGS. 2a and 2b show schematic side views of an electron beam apparatus according to a further embodiment.

In the electron beam apparatus (e.g. SEM) 200 of FIG. 2, the dispersion compensation element 204 includes a magnetic coil (magnetic deflector) 205 and an electric (electrostatic) deflector 206, both deflectors 205 and 206 being adapted to deflect the beam 201 within the same deflection plane (here, the deflection plane, i.e. the plane within which the beam is deflected, is the drawing plane of FIG. 2a). Further, the deflectors 205 and 206 are connected to a control apparatus 270 which is described in more detail below. In FIG. 2, the total deflection D of the dispersion compensation element 204 is chosen to have equal magnitude and opposite sign as the deflection of the beam separator 215. This allows a vertical column, and hence vertically aligned optical elements, in the regions upstream the deflector 205 and downstream of the deflector 215.

Further to the description of FIG. 1, FIG. 2a includes some additional elements of the electron beam apparatus 200 (these elements may also, but do not need to be present in the embodiment of FIG. 1): Namely, the apparatus 200 of FIG. 2a includes a plate 210 having openings for the primary and the signal beam, and a collecting arrangement (elements arranged along the beam path of the signal beam 235). Further, the apparatus 200 has a specimen receiver 232 defining a specimen plane 231 at which the specimen 230 interacts with the electron beam 201.

In the electron beam apparatus 200 of FIG. 2a, the primary-electron beam 201 travels as described with respect to FIG. 1, and additionally passes through an opening in a plate 210.

The resulting signal electron beam 235, after having been separated from the primary beam 201 by the beam separator 215, passes through a further opening in the plate 210 and is then guided to an electron detector 265 as described e.g. in U.S. Pat. No. 7,335,894 (see FIG. 5 and col. 9 line 57 to col. 10 line 56 thereof). The signal electron beam 235 could alternatively be guided to the detector in any other manner.

The electron beam device 200 further includes a specimen receiver 232 for receiving the specimen 230. The specimen receiver 232 defines a specimen plane 231 at which the specimen 230 interacts with the electron beam 201 during operation of the electron beam device 200.

The electron beam device 200 of FIG. 2a may include still further elements not shown in FIG. 2a. For example, the electron beam device 200 may include an energy filter for the primary electron beam 201, a beam boost electrode for accelerating the electron beam 201, and/or a scan system for scanning the beam 201 over the specimen. The scan system may include e.g. electrostatic deflection plates or magnetic deflection coils or a combination thereof. For example. the scan system may include between 4 and 16 electrostatic deflection plates, e.g. 8 electrostatic deflection plates. Also, the scan system may include at least two deflection coils (at least one coil for each scanning direction in the specimen plane). The deflection system is generally located downstream of the beam separator 215, i.e. inside or downstream of the objective lens 225.

Figure 2B:
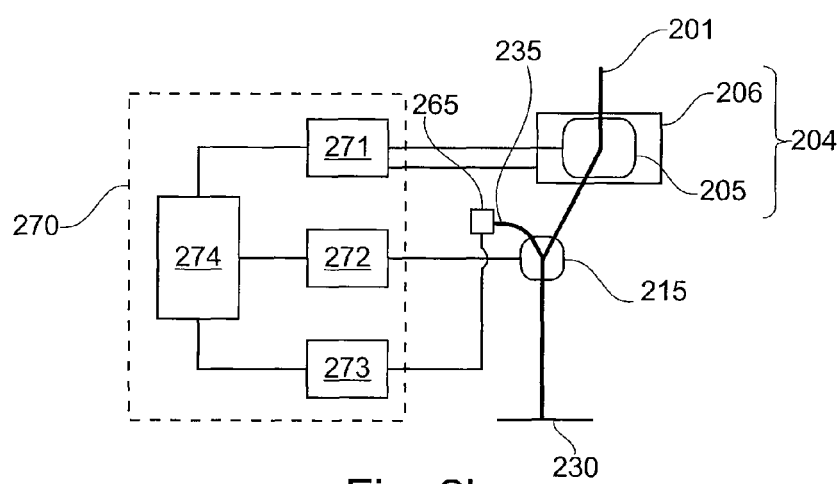

FIG. 2b shows the apparatus of FIG. 2a (with some optional elements omitted), and additionally a controller 270. The controller is adapted for adjusting the second dispersion independently of the inclination angle of the primary beam 201 downstream of the dispersion compensation element 204, such that the dispersion compensation element 204 acts on the primary beam according to the second dispersion such as to substantially compensate the first dispersion.

To this purpose, the controller 270 has a dispersion compensation controller 271 connected to the dispersion compensation element 204, a beam separation controller 272 connected to the beam separation element 215, an optional beam analyser 273 connected to the electron detector 265, and a main controller unit 274 connected to the controllers 271, 272 and 273.

As a general aspect independent of the shown embodiment, the dispersion compensation controller 271 is connected to the dispersion compensation element 204 and programmed, hard-wired or in any other way adapted for adjusting the second dispersion independently of an inclination angle of the primary beam 201 downstream of the dispersion compensation element 204. So, in the example shown in FIG. 2b, the dispersion compensation controller 271 is adapted for adjusting the deflections d1, d2 of the deflectors 205 and 206 such that their total deflection D=d1+d2 is held constant at a predetermined deflection.

According to one mode of operation, the controller 270 is adapted for operation according to a predetermined beam separation deflection of the beam separation element 215, as follows: The main controller unit 274 feeds the predetermined beam separation deflection to the beam separation controller 272, and the beam separation controller 272 controls the beam separation element 215 to cause the beams 201 and 235 to be deflected by the predetermined beam separation deflection, thereby causing a first dispersion of the beam 201. The main controller unit 274 then determines an appropriate second dispersion which compensates for the first dispersion, and transmits the second dispersion to the dispersion compensation controller 271. The dispersion compensation controller then causes the dispersion compensation element 204 to achieve the second dispersion.

The main controller unit 274 may determine the appropriate second dispersion by various methods. For example, according to a feedback control loop, the beam analyser 273 receives image information from the electron detector 265 and generates an image quality signal therefrom (e.g. a spot size indicative signal). The main controller unit 274 then receives the image quality signal from the beam analyser 273 for various second dispersions and then selects the appropriate second dispersion according to the image quality signal. Alternatively, the main controller unit 274 may calculate an appropriate second dispersion based on a model of the beam such as the model illustrated in FIG. 1. The criterion should be that the first-order chromatic aberration of the electron beam 201 hitting the specimen should be zero. Also, the main controller unit 274 may use take the appropriate second dispersion from a stored table of appropriate values for various parameters.

The controller 270 of FIG. 2b is adapted for the embodiment of FIGS. 2a and 2b. However, it is clear that by including some variations, the controller 270 may be adapted for any other embodiments shown or claimed herein, e.g. the embodiments of FIGS. 3a to 3h.

Further, while the dispersion compensation element of the embodiments of FIG. 1, FIG. 2a or FIG. 2b is suitable for adjusting the dispersion such that the total dispersion (first-order chromatic aberration) is zero, the apparatus does not necessarily need to operate in this manner. Instead, it may be sufficient to implement some approximate control of the dispersion compensation element, such that the total dispersion is sufficiently close to zero for the desired resolution. Alternatively, a beam having a particular total dispersion may be desired for some applications. In this case, the dispersion of the dispersion compensation element 104 can be adjusted to provide the desired total dispersion (which may be zero or non-zero).

In FIGS. 3a to 3h, possible realizations of the dispersion compensation element 104 are illustrated. Any of these elements can be used in place of the dispersion compensation element 104/204 of FIG. 1 or of FIG. 2.

Generally, the dispersion compensation element 104 may be equipped with two deflectors, e.g. an electric and a magnetic deflector, whose individual deflections (individual contributions, denoted as d1 and d2, respectively, to the total deflection of beam 101 at or near the main beam energy) are controlled such that the total deflection D=d1+d2 stays constant. Thus, the contribution of one of the deflectors, d1, can be varied. The other deflector is then controlled to provide the remaining deflection d2=D−d1. The deflections d1 and d2 can have the same sign or have opposite sign. In this manner, the dispersion can be varied by changing the value of d1, while the total deflection D is held constant. The total deflection D may be zero or have a finite value.

Further, the two deflectors of the dispersion compensation element 104 are selected to have respective dispersions which depend on their deflection in a different manner. For example, one of the deflectors may be an electric deflector and the other may be a magnetic deflector. In this case, the sum of their dispersions depends on the individual contributions d1 and d2 to the total deflection D, the total deflection D being kept constant. Similarly, the dispersion compensation element 104 can also include three or more deflectors.

Thus, the dispersion compensation element 104 allows adjusting the second dispersion such that the second dispersion substantially compensates the first dispersion, without need to worry about a change in the beam inclination further downstream of the dispersion compensation element 104. In some embodiments, the second dispersion is also adjustable independently of the entire beam path of the primary beam 101 (e.g. also independently of its displacement) downstream of the dispersion compensation element 104.

The dispersion compensation element 104 of FIG. 3a corresponds to that of FIG. 2, and the corresponding description of FIG. 2 also applies to FIG. 3a. In FIG. 3a, the dispersion compensation element 104 includes a magnetic deflector 105 and an electrostatic deflector 106. The deflectors 105, 106 are controlled to give a nonzero total deflection D that is opposite to the deflection of the beam separation element 115.

The dispersion compensation element 104 of FIG. 3b has similar elements as the one of FIG. 3a, and the description of FIG. 3a also applies to FIG. 3b unless specified otherwise. However, different from FIG. 3a, the deflectors 105, 106 are controlled to give a zero total deflection D. Hence, the dispersion compensation element 104 is a Wien filter. The dispersion of the Wien filter can be adjusted by tuning the individual deflections d1 and d2 simultaneously so that always D=d1+d2=0.

The beam 101 upstream of the beam separator 115 in FIG. 3b is thus inclined with respect to the optical axis. Correspondingly the beam source 102 and any other electron-optical elements upstream of the beam separator 135 are adapted for the inclined beam 101.

FIG. 3c shows an arrangement of dispersion compensation element 104 and beam separator 115 which is similar to that of FIG. 3a, but in which the dispersion compensation element 104 is tilted with respect to the optical axis. More precisely, the dispersion compensation element 104 is tilted such that its axis 104a has a non-zero angle with respect to the incoming beam 101. This angle is smaller than the deflection angle, i.e. the angle between the incoming beam and the outgoing beam from the dispersion compensation element 104. In particular, this angle may be half of the deflection angle. The axis 104a may be defined, for example, as being perpendicular to a main magnetic field as well as to a main electric field of the dispersion compensation element.

FIG. 3d shows an arrangement of dispersion compensation element 104 and beam separator 115 which is similar to that of FIG. 3b, but in which the dispersion compensation element (Wien filter) 104 is tilted with respect to the optical axis. More precisely, the dispersion compensation element 104 is tilted such that its axis 104a is parallel to the incoming beam 101. In contrast, the beam separator 115 (see FIG. 1) is parallel to the optical axis.

In dispersion compensation element 104 of FIG. 3e, the magnetic deflector 105 and the electrostatic deflector 106 are spatially separated from one another along the primary beam 101. The deflectors 105 and 106 are controlled such as to provide a total deflection D=d1+d2 that is equal in magnitude but opposite to the deflection of the beam separation element 115 (similarly to FIG. 3a).

Due to the spatial separation of the deflectors 105, 106, the beam is displaced, due to a similar effect as described with reference to FIG. 5. As a result, this displacement can be seen as an additional contribution to the second dispersion (dependence of the location of the beam 101 hitting the specimen on beam energy) of the dispersion correction element 104. This additional contribution may be taken into account when the deflections d1 and d2 are adjusted such that in the end the total dispersion is zero. When the deflectors 105, 106 are displaced only by a small distance, the additional contribution to the second dispersion may also be neglected.

In FIG. 3e, the electrostatic deflector 106 is arranged upstream, along the primary beam 101 path, of the magnetic deflector 105. In an alternative variant, the electrostatic deflector 106 may be arranged downstream of the magnetic deflector 105. Further, in FIG. 3e, the deflectors 105, 106 are controlled to provide deflections in the same direction. Alternatively, the deflectors 105, 106 may be controlled to provide deflections in opposite direction such that the deflection of deflectors 105, 106 partially or fully cancel each other.

In dispersion compensation element 104 of FIG. 3f, the dispersion compensation element 104 contains a magnetic deflector 105 and a beam-tilter 107. Alternatively, the magnetic deflector 105 can also be replaced by an electrostatic deflector or another type of deflector.

The beam-tilter 107 has the effect of tilting the incoming electron beam 101 as seen by the magnetic deflector 105, or in other words of tilting the inclination angle of the virtual image of the beam source 102 as seen by the magnetic deflector 105.

The beam tilter 107 can, in principle, be implemented as a mechanical beam tilter for swiveling the beam source about a center, the center being preferably located at the center of the deflector 105. In the case of a mechanical beam-tilter 107, the beam-tilter has no dispersion, thus the total dispersion of the dispersion compensation element 104 equals the dispersion of the magnetic deflector 105.

Alternatively, the beam tilter 107 can be implemented by a deflector 106 as shown e.g. in FIG. 3a or 3c, or by a series of deflectors (electrostatic, magnetic, some other deflector, or combination thereof). In this case, the physical position of the beam source 102 may remain unchanged, and only the virtual source position is changed. The deflector of the beam tilter 107 is preferably of different type than the deflector 105, because otherwise the net dispersion of the beam tilter 107 and the deflector 105 would largely cancel so that the dispersion cannot be adjusted easily.

Also, the beam-tilter 107 can include a combination of a mechanical beam-tilter and of one or more deflector(s) (electric or magnetic or combination thereof). Then, the angle of the beam tilter 107 and the deflection due to the deflector 105 can be adjusted together such that the inclination angle of the primary beam 101 downstream of the deflector 105 is unchanged. Hereby, the second dispersion is adjusted. In particular, the second dispersion can be adjusted such that the second dispersion substantially compensates the first dispersion.

FIG. 3g shows a similar arrangement as that of FIG. 3a, but in which the beam 101 directly upstream the dispersion compensation element 104 is inclined with respect to the optical axis. The inclination may be adjustable as in FIG. 3f, but does not need to be adjustable as long as the dispersion is adjustable. In the following, an apparatus with non-adjustable inclination but adjustable dispersion is described.

In FIG. 3g the beam upstream the dispersion compensation element 104 and the beam downstream the beam separator 115 are not parallel to each other. In other words, the deflection angles of the dispersion compensation element 104 and of the beam separator 115 of FIG. 3g have different absolute values.

The beam apparatus may be adapted for a particular rated beam energy. In this case, the inclination angle of the beam 101 directly upstream the dispersion compensation element 104 can be chosen such that for zero electric field of the electrostatic deflector 106 and at the rated beam energy, the total first-order chromatic aberration of the beam 101 is zero. This inclination may be found by a numerical simulation of the beam path of beam 101. Alternatively, the inclination may be found by tuning an apparatus with adjustable inclination (such as the apparatus of FIG. 3f, until the chromatic aberration vanishes.

With this inclination, the dispersion of the dispersion compensation element 104 can be adjusted as in FIG. 3a, by simultaneous adjustment of the deflectors 105 and 106 keeping the total deflection D=d1+d2 constant. Here, for energies near the rated energy, only a small electrical field is needed. Therefore, the electrodes can be arranged relatively far away from the beam 101, where they are less prone to contamination.

FIG. 3h shows a further variation of the apparatus of FIG. 3g, and the above description of FIG. 3g also applies to FIG. 3h. However, while in FIG. 3g the electric and magnetic deflectors 105, 106 of the dispersion compensation element 104 are overlapping each other (as also shown above in FIG. 3a), in FIG. 3h they are located at different positions along the beam path of the electron beam 101 (as also shown above in FIG. 3b).

In the following, with reference to FIG. 4, the objective lens 125 and the arrangement of the beam separation element 115 inside the objective lens 125 are described. Generally, the objective lens is a beam focusing lens for focusing the primary beam 101 on the specimen 130, more specifically a final focusing lens. The objective lens 125 may also be adapted for demagnifying the crossover of the electron beam 101.

Figure 4:
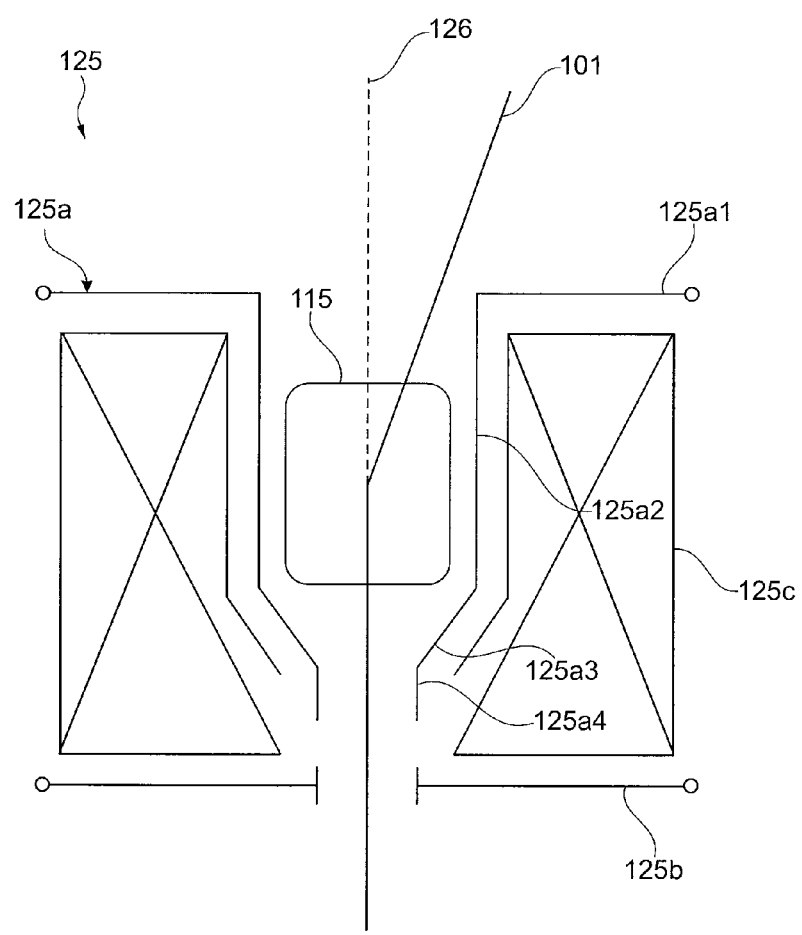
FIG. 4 shows a schematic side view of an objective lens body and a beam separation element immersed therein.

The objective lens 125 (more precisely, the lens body) shown in FIG. 4 is a compound lens having a magnetic lens element 125c. In addition, an upper (upstream) electrode 125a and a lower (downstream) electrode 125b are provided as part of the objective lens body. The upper electrode 125a is at a higher potential than the electrode 125b. The upper electrode 125a has, in direction from upstream to downstream, an electrode plate 125a1 with an opening, a first cylindrical portion 125a2, a tapered portion 125a3, and a second cylindrical portion 125a4. The upper electrode 125a is arranged concentrically to the optical axis 126. The inner diameter of the first cylindrical portion 125a2 is larger than the inner diameter of the second cylindrical portion 125a4, and the tapered portion 125a3 connects these two portions 125a2 and 125a4.

The electrodes 125a, 125b may be biased in such a way that the lower electrode decelerates and thereby focuses the beam. The magnetic lens element 125c serves for adjusting the focusing effect of the lens. In a purely electrostatic lens, the magnetic lens element 125c may be replaced by a third electrostatic electrode.

The beam separation element 115 is placed at least partially inside the lens 125, i.e. there is a cross-sectional plane perpendicular to the optical axis 126 containing both a portion of the lens 125 (magnetic lens element 125c) and a portion of the beam separation element 115. Alternatively stated, the beam separation element 115 is placed inside the magnetic lens surrounding a liner tube. Further, the beam separation element 115 is placed more towards the entry (most upstream portion) than towards the exit (most downstream portion) of the lens body of lens 125. Generally and not limited to the embodiment of FIG. 4, the beam separation element 115 is placed at least partially inside a bore of the lens and/or of the upper electrode 125a. For the electrode shown in FIG. 4, the beam separation element 115 may be placed at least partially inside the first cylindrical portion 125a2 of the upper electrode 125a.

The objective lens 125 is shown as a compound electric-magnetic lens, but it may also be a different type of lens such as an electrostatic lens. In any case, the lens may have one or more focusing electrode(s) for focusing the primary beam. The focusing electrode may at the same time serve for decelerating the beam to a predetermined energy. The focusing electrode may further be supplemented by an adjustment electrode and/or another adjustment arrangement (such as a magnetic arrangement 125c as shown in FIG. 4) for adjusting and fine-tuning the focus. A further electrode may be controlled to have specimen potential. The beam separator may in any case be immersed into the lens body as shown in FIG. 4, or directly upstream of the objective lens, i.e. with no other beam-optical element inbetween. Also, a beam scanner may be provided between the beam separator and the objective lens downstream of the beam separator. In particular, the beam scanner may be provided as the only element therebetween. The beam scanner may be a magnetic or electrostatic scanner. Also, the scanner may at the same time have additional functionality such as in the case of an electrostatic scanner whose electrostatic octupol element also provides a stigmator field. Also, the beam separator is generally arranged such that its magnetic deflection field does substantially not overlap with the electrostatic focusing field of the objective lens.

The objective lens 125 may be a double-focusing sector unit including a sector (a quadrupole unit, and cylinder lens or side plates) for focusing in a first dimension and a sector for focusing in a second direction. The objective lens 125 may alternatively also be an Einzel-lens or any other type of lens.

According to a general aspect, the beam separator 115 is located in the bore of the objective lens 125, but outside a region of substantial focusing electrical field of the objective lens 125. Thereby, a substantial superposition of magnetic deflection field of the beam separator 115 and of electric focusing field of the lens 125 are avoided.

Further, a scanning unit (not shown) may be provided. The scanning unit may be positioned either within the lens 125 (e.g. downstream of the beam separator 115) or further downstream of the lens 125, i.e. positioned between the lens and the specimen.

The above embodiments can be varied in a number of further ways. For example, the structure for guiding the signal electron beam to the beam detector can be arbitrarily varied. Generally, the structure includes focusing and filtering optics for the signal electron beam which have no effect on the primary electron beam.

Further, the electron beam device can include a plurality of columns, each column including a respective beam source and the other elements as described herein, such as some or all elements shown in FIG. 1. Also, the electron beam apparatus can include further electron-optical elements such as a scanning arrangement downstream of the electron objective lens.

In the following, some further general aspects of the invention are described. Any of these aspects may be combined with any other aspect or embodiment described herein.

According to an aspect, the beam separator is a deflector for deflecting the primary electron beam. In particular, the beam separator is a purely magnetic deflector, i.e. it contains no other, e.g. electrostatic, deflecting component, and in particular includes a magnetic dipole element as the only deflecting element. Hence, no electric deflector is included (unlike e.g. a Wien filter element).

According to a further aspect, the beam separator is adapted for receiving the primary beam as an inclined beam with respect to the optical axis, and for deflecting the primary beam such that the primary beam exits the beam separator essentially in parallel to the optical axis.

According to a further aspect, The electron beam device further includes a specimen receiver for receiving a specimen, the specimen receiver defining a specimen plane at which the specimen interacts with the electron beam during operation of the electron beam device. Further, the distance of the beam separator from the specimen plane is less than 100 mm, less than 70 mm, or even less than 50 mm, and/or less than ¼ of the total beam length of the primary beam. In this manner, the common path of the primary and secondary electrons is enabled to be less than this distance. According to a further aspect, the inclination angle of the primary electron beam directly upstream of the beam separator is less than 10°. According to a further aspect, the beam separator is placed at least partially in an upstream half portion of the lens. According to a further aspect, the distance of the optical lens from the specimen plane is less than 70 mm, or even less than 50 mm, and/or less than ¼ of the total beam length of the primary beam.

According to a further aspect, the dispersion compensation element is adapted for inclining the electron beam by less than 20°, less than 12°, or even less than 10°. Also, according to a yet further aspect, the beam separator is adapted for inclining the electron beam by less than 20°, less than 12°, or even less than 10°.

According to a further aspect, the lens has an electrode having a cylindrical upstream portion of larger inner diameter and a cylindrical downstream portion of smaller inner diameter, and the beam separator is placed at least partially inside the upstream portion.

According to a further aspect, the beam separation element and/or the dispersion compensation element are provided at a cross-over-free beam path position of the primary beam, i.e. at a position at which there is no cross-over of the beam during operation of the apparatus.

According to a further aspect, the dispersion compensation element and the beam separator are adapted for deflecting the electron beam within the same plane.

According to a further aspect, the dispersion compensation element is adapted for adjusting the second dispersion relation independently of a path of the primary beam, in particular for adjusting it independently of the entire path from the emitter to the specimen. Then, the dispersion compensation element acts in a dispersive manner substantially without affecting the entire primary beam path, for electrons of a main velocity. According to a further aspect, the dispersion compensation element includes a first deflector and a second deflector, wherein the first deflector and the second deflector have mutually different dispersion characteristics. This is e.g. the case for an electric deflector and a magnetic deflector. More specifically, the dispersion characteristics of both deflectors are different from one another if there is at least one deflection angle magnitude for which the dispersion of the first deflector is different from that of the second deflector, for a main energy of the electron beam. According to a further aspect, the deflectors are adapted for deflecting the electron beam in mutually opposite directions such that the deflection cancels each other but the dispersions do not cancel each other.

According to a further aspect, the electron beam device is adapted for controlling the first and second deflectors to have substantially opposite deflection angles. Thus, a dispersion compensation element controller is adapted for supplying a first deflection power to the first deflector and a second deflection power to the second deflector such that the deflection angles of the first and the second deflector are substantially opposite one another. "substantially opposite" means opposite for a main energy beam portion of the primary beam.

According to a further aspect, a dispersion compensation element controller is adapted for controlling the first and second deflectors to have deflection angles that add up to a pre-determined deflection angle, the pre-determined deflection angle being equal in magnitude but opposite to the deflection angle of the beam separator.

According to a further aspect, the dispersion compensation element is arranged outside a secondary electron path of the electron beam device, i.e. in a primary-electron-beam-only region.

According to a further aspect, the first dispersion is anisotropic defining a first deflection direction orthogonal to the optical axis, and the second dispersion is also anisotropic defining a second deflection direction parallel to the first deflection direction (herein, "parallel" also includes the case antiparallel).

According to a further aspect, the electron beam device includes a dispersion compensation controller adapted for adjusting the second dispersion substantially independently of an inclination angle of the primary beam downstream of the dispersion compensation element, such that the dispersion compensation element acts on the primary beam according to the second dispersion such as to substantially compensate the first dispersion. According to a further aspect, the magnetic beam separator is adapted for acting outside a region of a substantial electric field of the objective lens.

While the foregoing is directed to embodiments of the invention, further embodiments of the invention may be devised without departing from the basic scope thereof, and the scope thereof is determined by the claims that follow.

The invention claimed is:

1. An electron beam device, comprising:
   a beam emitter for emitting a primary electron beam;
   an objective electron lens for focusing the primary electron beam onto a specimen, the objective lens defining an optical axis;
   a magnetic beam separator having a magnetic element as the only deflecting element, wherein the magnetic beam separator has a first dispersion and separates a signal electron beam from the primary electron beam; and
   a dispersion compensation element having a second dispersion and arranged upstream of the magnetic beam separator along the primary electron beam, wherein the dispersion compensation element adjusts the second dispersion independently of an inclination angle of the primary electron beam to compensate for the first dispersion, and wherein the dispersion compensation element comprises a first deflector and a second deflector, wherein the first deflector is a magnetic deflector and the second deflector is an electrostatic deflector, wherein the first and second deflectors are adapted for deflecting the electron beam in mutually opposite directions such that dispersions of the first and second deflectors do not cancel each other.

2. The electron beam device according to claim 1, wherein the magnetic beam separator is adapted for receiving the primary beam as an inclined beam with respect to the optical axis, and for deflecting the primary beam such that the primary beam downstream of the magnetic beam separator is essentially parallel to the optical axis.

3. The electron beam device according to claim 1, further comprising a specimen receiver for receiving a specimen, the specimen receiver defining a specimen plane at which the specimen interacts with the electron beam during operation of the electron beam device, wherein the distance of the magnetic beam separator from the specimen plane is less than ¼ of the primary beam length.

4. The electron beam device according to claim 1, wherein the primary electron beam is inclined, and wherein the inclination angle of the primary electron beam directly upstream of the magnetic beam separator is less than 20°.

5. The electron beam device according to claim 1, wherein at least one of the magnetic beam separator and the dispersion compensation element is provided at a cross-over-free beam path position of the primary beam.

6. The electron beam device according to claim 1, wherein the dispersion compensation element and the magnetic beam separator are adapted for deflecting the primary electron beam within the same plane.

7. The electron beam device according to claim 1, wherein the dispersion compensation element is adapted for adjusting the second dispersion independently of a path of the primary beam.

8. The electron beam device according to claim 1, wherein the first and second deflectors are adapted for deflecting the electron beam in mutually opposite directions such that the deflection cancels each other.

9. The electron beam device according to claim 8, adapted for controlling the first and second deflectors to have substantially opposite deflection angles.

10. The electron beam device according to claim 8, adapted for controlling the first and second deflectors to have deflection angles that add up to a pre-determined deflection angle, the pre-determined deflection angle being equal in magnitude but opposite to the deflection angle of the magnetic beam separator.

11. The electron beam device according to claim 1, wherein the magnetic beam separator is immersed in a body of the objective lens.

12. The electron beam device according to claim 11, wherein the magnetic beam separator is placed at least partially in an upstream half portion of the lens body.

13. The electron beam device according to claim 1, wherein the dispersion compensation element is arranged outside a secondary electron path of the electron beam device.

14. The electron beam device according to claim 1, wherein the first dispersion is anisotropic defining a first deflection direction orthogonal to the optical axis, and wherein the second dispersion is anisotropic defining a second deflection direction parallel to the first deflection direction.

15. The electron beam device according to claim 1, comprising a dispersion compensation controller adapted for adjusting the second dispersion substantially independently of an inclination angle of the primary beam downstream of the dispersion compensation element, such that the dispersion compensation element acts on the primary beam according to the second dispersion such as to substantially compensate the first dispersion.

16. A method of operating an electron beam device, the method comprising:
generating a primary electron beam;
focusing, by means of an objective electron lens, the primary electron beam onto a specimen;
generating a signal electron beam by interaction of the primary beam with the specimen;
acting, by a magnetic beam separator, on the primary electron beam and on the signal electron beam according to a first dispersion thereby separating the signal electron beam from the primary electron beam, wherein the magnetic beam separator deflects the primary electron beam by a magnetic element as the only deflecting element; and
adjusting a second dispersion of a dispersion compensation element, independently of an inclination angle of the primary beam downstream of the dispersion compensation element, such that the dispersion compensation element acts on the primary beam according to the second dispersion such as to achieve a predetermined total dispersion, wherein the dispersion compensation element comprises a magnetic deflector and an electrostatic deflector, wherein the magnetic and electrostatic deflectors are adapted for deflecting the electron beam in mutually opposite directions such that dispersions of the first and second deflectors do not cancel each other.

* * * * *

UNITED STATES PATENT AND TRADEMARK OFFICE
CERTIFICATE OF CORRECTION

| | | |
|---|---|---|
| PATENT NO. | : 9,048,068 B2 | Page 1 of 1 |
| APPLICATION NO. | : 12/776980 | |
| DATED | : June 2, 2015 | |
| INVENTOR(S) | : Lanio et al. | |

It is certified that error appears in the above-identified patent and that said Letters Patent is hereby corrected as shown below:

IN THE SPECIFICATION

Column 12, Line 46, please delete "3*f*" and insert -- 3f) -- therefor.

Signed and Sealed this
Eighth Day of December, 2015

Michelle K. Lee
*Director of the United States Patent and Trademark Office*